(12) United States Patent
Abbott

(10) Patent No.: US 6,706,561 B2
(45) Date of Patent: Mar. 16, 2004

(54) METHOD FOR FABRICATING PREPLATED NICKEL/PALLADIUM AND TIN LEADFRAMES

(75) Inventor: Donald C. Abbott, Chartley, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/073,523

(22) Filed: Feb. 11, 2002

(65) Prior Publication Data

US 2003/0153129 A1 Aug. 14, 2003

(51) Int. Cl.$^7$ .................. H01L 21/44; H01L 21/48; H01L 21/50
(52) U.S. Cl. .............. 438/123; 438/121; 438/111; 29/827
(58) Field of Search ................ 438/123, 121, 438/111; 29/827

(56) References Cited

U.S. PATENT DOCUMENTS

| | | |
|---|---|---|
| 3,716,764 A | 2/1973 | Birchler et al. |
| 4,034,027 A | 7/1977 | Smith, Jr. |
| 6,194,777 B1 | 2/2001 | Abbott et al. |
| 6,246,446 B1 | 6/2001 | Heimbuch et al. |
| 6,376,901 B1 | 4/2002 | Abbott |
| 6,545,344 B2 | 4/2003 | Abbott |
| 2001/0054750 A1 * | 12/2001 | Abbott |
| 2002/0146864 A1 * | 10/2002 | Mikaki et al. |

FOREIGN PATENT DOCUMENTS

EP    0 335 608 B1    6/1995

* cited by examiner

Primary Examiner—David A. Zarneke
(74) Attorney, Agent, or Firm—Wade James Brady III; Frederick J. Telecky, Jr.

(57) ABSTRACT

A method for fabricating a leadframe structure comprising a chip mount pad and a plurality of lead segments, each having a first end near the mount pad and a second end remote from said mount pad. The structure is formed from a sheet-like starting material. In a first plating system, the leadframe is plated with a layer of nickel. Next, the second segment ends are selectively masked and a layer of palladium is selectively plated on the nickel layer on the exposed chip pad and first segments ends in a thickness suitable for wire bonding attachment. In a second plating system, the chip pad and first segment ends are selectively masked and a pure tin layer is selectively plated on the nickel layer on the exposed second segment ends in a thickness suitable for parts attachment.

9 Claims, 2 Drawing Sheets

METHOD FOR FABRICATING PREPLATED NICKEL/PALLADIUM AND TIN LEADFRAMES

FIELD OF THE INVENTION

The present invention is related in general to the field of semiconductor devices and processes and more specifically to the materials and fabrication of leadframes for integrated circuit devices.

DESCRIPTION OF THE RELATED ART

The leadframe for semiconductor devices was invented (U.S. Pat. Nos. 3,716,764 and 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

It has been common practice to manufacture single piece leadframes from thin (about 120 to 250 μm) sheets of metal. For reasons of easy manufacturing, the commonly selected starting metals are copper, copper alloys, iron-nickel alloys (for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

In the European patent No. 335 608 B1, issued Jun. 14, 1995 (Abbott, "Leadframe with Reduced Corrosion"), U.S. Pat. No. 6,194,777, issued Feb. 27, 2001 (Abbott, "Leadframes with Selective Palladium Plating"), and No. 6,246,446, issued Jun. 12, 2001 (Abbott, "Leadframe with Reduced Corrosion"), a palladium-plated leadframe is introduced which is not subject to corrosion due to galvanic potential forces aiding the migration of the base metal ions to the top surface where they will form corrosion products. The patent describes a sequence of layers consisting of nickel (over the base metal), palladium/nickel alloy, nickel, and palladium (outermost). This technology has been widely accepted by the semiconductor industry.

After assembly on the leadframe, most ICs are encapsulated, commonly by plastic material in a molding process. It is essential that the molding compound, usually an epoxy-based thermoset compound, has good adhesion to the leadframe and the device parts it encapsulates. Palladium, described above as the outermost layer of the leadframe, offers excellent adhesion to molding compounds.

Nickel/palladium plated leadframes are used because of their low total cost of ownership, primarily a result of eliminating post-mold solder plating. However, some customers, for instance automotive manufacturers and telephone central switching offices, require solder plated external leads, typically because of burn-in, accelerated testing or environmental conditions.

If solder dipping is used after molding, the palladium will dissolve into the solder and the nickel is then solderable. However, solder dipping is not practical for devices with fine-pitch leadframes because of solder bridging.

The price of palladium climbed in the last decade to approximately twice the gold price. Cost reduction pressures in semiconductor manufacturing have initiated efforts to reduce the thickness of the palladium layers employed to about one third of its previous thickness. At this thinness, palladium does not prevent oxidation of the underlying nickel which will inhibit its solderability.

In U.S. patent applications Ser. No. 60/138,070, filed on Jun. 8, 1999 (Abbott, "Palladium-Spot Leadframes for Solder Plated Semiconductor Devices and Method of Fabrication"), and No. 60/214,314, filed on Jun. 27, 2000 (Abbott, "semiconductor Leadframes Plated with Lead-Free Solder and Minimum Palladium"), to which the present invention is related, a fabrication process for palladium layers of reduced thickness is described. There is, however, a problem for pre-plated leadframes in the selection of a tin-based solder without the risk of tin dendrite growth. Further, there is a severe discrepancy between the high speed and throughput of nickel and palladium plating for the desired thicknesses, and the roughly 20× slower tin plating for the desired thickness.

An urgent need has therefore arisen for a low-cost, reliable mass production method for a leadframe combining the advantages of palladium with its bondability and adhesion capability to molding compounds, and the application of pre-plated tin solder. The palladium layer should have reduced thickness. The leadframe and its method of fabrication should be flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

The present invention describes a method for fabricating a leadframe structure comprising a chip mount pad and a plurality of lead segments, each having a first end near the mount pad and a second end remote from said mount pad. The structure is formed from a sheet-like starting material. In a first plating system, the leadframe is plated with a layer of nickel. Next, the second segment ends are selectively masked and a layer of palladium is selectively plated on the nickel layer on the exposed chip pad and first segments ends in a thickness suitable for wire bonding attachment. In a second plating system, the chip pad and first segment ends are selectively masked and a pure tin layer is selectively plated on the nickel layer on the exposed second segment ends in a thickness suitable for parts attachment.

The present invention is related to high density ICs, especially those having high numbers of inputs/outputs, or contact pads, and also to devices in packages requiring surface mount in printed circuit board assembly. These ICs can be found in many semiconductor device families such as standard linear and logic products, digital signal processors, microprocessors, digital and analog devices, and both large and small area chip categories. The invention represents a significant cost reduction and enhances environmental protection and assembly flexibility of semiconductor packages, especially the plastic molded packages, compared to the conventional copper-based post-mold-plated leadframes.

It is an aspect of the present invention to provide a technology for enabling solder package leads with pre-plated pure tin, while maintaining a palladium layer in the localized areas intended for wire bonding with its significant cost advantage over the traditional silver spot plated inner leads.

Another aspect of the invention is to provide the tin as a matte, coarse grain, low carbon content deposit of relatively high thickness (about 4 to 6 $\mu$m). The tin annealing is a by-product of the molding compound curing after encapsulation. Tin whiskers on the outside of the package are suppressed by the nickel.

Another aspect of the invention is to reach these goals with a low-cost manufacturing method without the cost of equipment changes and new capital investment, by using the installed fabrication equipment base.

The invention utilizes a first, wheel-based plating system to deposit the nickel and palladium layers, and a second, flood cell system to deposit the tin layer.

Another aspect of the invention is to produce leadframes so that established wire bonding processes can continue unchanged, and that established board attachment process can continue unchanged.

Another aspect of the invention is to eliminate silver and the cyanide solution used for its deposition from the leadframe manufacturing process flow, resulting in less costly waste treatment.

Another aspect of the invention is to introduce a palladium spot plating technology with provides loose tolerance for the spot boundaries, thus simplifying leadframe manufacturing and lowering fabrication cost.

These aspects have been achieved by the teachings of the invention concerning deposition and masking methods suitable for mass production. Various modifications of leadframe preparations have been successfully employed.

In the preferred embodiment of the invention, a plated layer of nickel is fully covering the leadframe base material. A plated layer of pure tin is plated onto the nickel layer so that it covers selectively leadframe areas intended for parts attachment, especially board assembly. A layer of palladium is then plated onto the nickel layer so that it covers selectively the leadframe areas intended for bonding wire attachment.

Leadframes prepared according to the invention can be successfully used in surface mount technologies based on bending the package lead segments.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
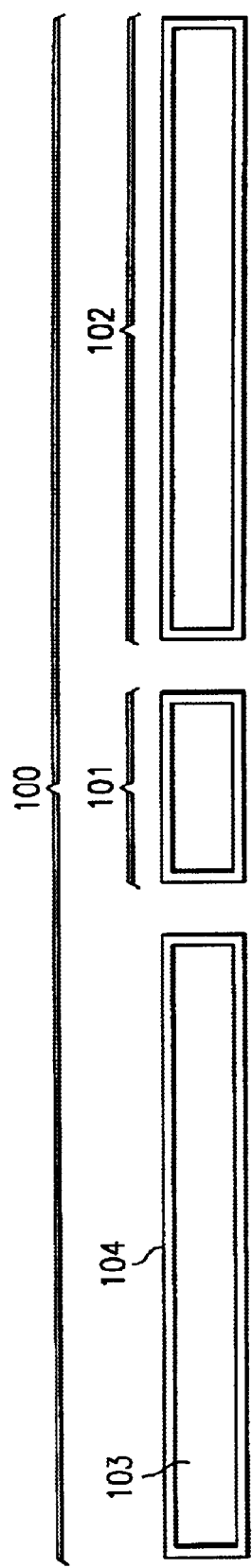
FIG. 1 is a schematic and simplified cross sectional view of a leadframe with base metal and first plated metal.

The present invention is related to U.S. patent applications Ser. No. 60/214,314, filed on Jun. 27, 2000 (Abbott, "Semiconductor Leadframes Plated with Lead-free Solder and Minimum Palladium") and #TI-33737, submitted on Feb 1,2002 (Abbott et al., "Semiconductor Leadframes Plated with Thick Nickel, Minimum Palladium, and Pure Tin"), which are herewith incorporated by reference. The present invention is further related to U.S. patent application Ser. No. 60/138,070, filed on Jun. 8, 1999 (Abbott, "Palladium-Spot Leadframes for Solder Plated Semiconductor Devices and Method of Fabrication").

The present invention is related to the composition and sequential construction of semiconductor leadframes and to the assembly of semiconductor chips on leadframes. This assembly includes wire bonding interconnection, chip encapsulation, and the environmentally friendly process of reliable attachment of the devices to substrates using lead-free solder.

The invention reduces the cost of leadframes while the leadframe functions are maximized. The invention best applies to any leadframe and any substrate used in semiconductor technology which exhibit the following design features: Usually, a chip mount pad for support of the IC chip surrounded by lead segments, each having a first end in proximity of the chip pad, and a second end remote from the chip pad. The invention thus applies to semiconductor package types such as PDIPs, SOICs, QFPs, SSOPs, TQFPs, TSSOPs and TVSOPs.

As defined herein, the starting material of the leadframe is called the "base metal", indicating the type of metal. Consequently, the term "base metal" is not to be construed in an electrochemical sense (as in opposition to 'noble metal') or in a structural sense. The base metal of leadframes is typically copper or copper alloys. Other choices comprise brass, aluminum, iron-nickel alloys ("Alloy 42"), and invar.

Leadframe segments have to satisfy five needs in semiconductor assembly:

1) Leadframes have to comprise segment ends remote from the chip mount pad ("outer segments") for solder attachment to other parts;
2) leadframes have to comprise segment ends near the chip mount pad ("inner segments") for bond attachments to wire interconnections;
3) leadframes have to comprise outer segments ductile for forming and bending the segments;
4) leadframe surfaces have to comprise adhesion to molding compounds; and
5) leadframe segments have to comprise insensitivity to corrosion.

According to the teachings of this invention, Need 1) is satisfied by depositing a layer of nickel, fully covering the leadframe base metal, and then selectively preplating a layer of pure tin onto the nickel layer only onto those leadframe areas which are intended for parts attachment.

The invention satisfies Need 2) by first plating the nickel layer, fully covering the leadframe base metal as outlined above, and then plating a thin layer of palladium (or, if desired, of silver) onto the nickel layer, selectively covering areas of the leadframe which are intended for bonding wire attachment (and chip attachment). For palladium, a thin layer is sufficient for reliable bonding wire attachment (stitch bonds, ball bonds, or wedge bonds).

The invention satisfies Need 3) by the selection of thickness and structure of the nickel layer employed to fulfill need 1). Thickness and deposition method of the nickel layer have to be selected such that the layer insures ductility and enables the bending and forming of the outer lead segments.

The invention satisfies Need 4) by the choice of the noble metal layer employed to fulfill need 2); a practical selection is palladium with its excellent adhesion to thermoset molding compounds and other encapsulation materials.

The invention satisfies Need 5) by the sequence of layers deposited over the copper base: Nickel and pure tin.

FIG. 1 is a schematic and simplified cross section of a leadframe portion, generally designated 100, and shows the chip mount pad 101 and a plurality of lead segments 102. The leadframe is made of a base metal 103 fully covered with a plated layer 104. The base metal usually is copper or copper alloy, but may also be aluminum, brass, an iron-nickel alloy, or invar. The copper or copper alloy base sheet 103 has a preferred thickness in the range from 100 to 300 $\mu$m; thinner sheets are possible. The ductility in this thickness range provides the 5 to 15% elongation needed in the segment bending and forming operation. The leadframe is stamped or etched from the starting metal sheet. The plated nickel layer has a preferred thickness is the range from about 0.2 to 3.0 $\mu$m.

In the plating process, the stamped or etched leadframe is first immersed in an alkaline preclean solution at 20 to 90° C. for few seconds up to 3 minutes. Both alkaline soak cleaning and alkaline electrocleaning are employed. Oils, grease, soil, dirt and other contamination are thereby removed.

After rinsing, the leadframe is next immersed in an acid activation bath at room temperature for few seconds up to 5 minutes. The bath consists of a solution of sulfuric acid, hydrochloric acid, or other acid solution, preferably at about 30 to 60 g/l concentration. This solution removes copper oxide and leaves the metallic copper surface in an activated state, ready to accept the deposition of metallic nickel.

Next, the leadframe is immersed in a first nickel plating solution to receive the deposition onto the copper base material of a nickel strike in the thickness range of about 0.02 to 0.13 $\mu$m. This first nickel layer fully encases the copper base metal and thus keeps the subsequent main nickel bath free from copper and copper compounds.

Next, the leadframe is immersed in a second nickel plating solution to receive the deposition onto the first nickel layer of an additional nickel layer in the thickness range of about 0.45 to 2.0 $\mu$m. The total thickness range of layer 104 is approximately 0.5 to 3.0 $\mu$m. This nickel layer has to be ductile for the leadframe segment bending and forming process. Further, the nickel surface has to be wettable in the soldering process, so that solder alloys or conductive adhesives can be used successfully.

Figure 2:
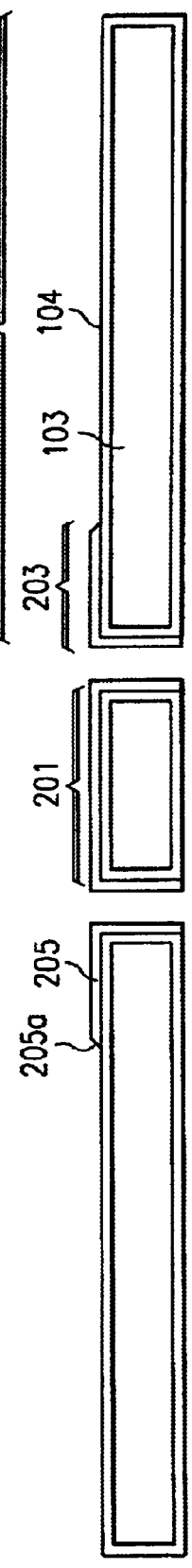
FIG. 2 is a schematic and simplified cross sectional view of a leadframe after the plating step for wire bonding enhancement according to the invention.

The schematic cross section of a leadframe in FIG. 2 depicts the thin palladium layer 205, plated on the area of chip pad 201 and the first ends 203 of segment 202 near the chip pad. The deposited layer 205 comprises an electroplated palladium layer in the thickness range of about 20 to 60 nm. Another choice as noble metal would be silver or rhodium. The palladium thickness could possibly reduced to about 10 and 30 nm. The area portion 203 of the plurality of lead segments is determined by the technical requirement of the intended wire bonding attachment. In the schematic example of FIG. 2, layer 205 terminates at boundary 205a. It is an advantage of the invention that boundary 205a may have loose tolerances.

In this thickness range, palladium is suitable for all wire bonding attachments (stitch bonds, ball bonds, and wedge bonds) and retains its excellent adhesion to thermoplastic molding compounds—an attribute crucial for avoiding package delamination and progressive corrosion. It should further be noted that the surface of the leadframe that is not spot-plated with palladium has on the order of 1 to 5 nm of palladium on it. Consequently, the surface has some nickel and some palladium character to it. After the thermal excursions of the device assembly process, the surface should have an adherent layer of nickel oxide that can provide superior molding compound adhesion.

It is an important aspect of the present invention to deposit the palladium layer selectively onto the leadframe by using an inexpensive masking step. The selective characteristic of the palladium deposition is achieved by a temporary masking step, which leaves only those leadframe portions exposed which are intended to receive the palladium layer.

There are several methods to selectively deposit metals from solution onto a continuous strip. For high volume production of leadframes, continuous strip or reel-to-reel plating is advantageous and common practice. Based on the loose tolerance acceptable for the boundaries of the palladium plating on the inner ends of the lead segments, the preferred deposition method for the present invention is the so-called "wheel system". The process steps are as follows.

WHEEL SYSTEM
Material is moved over a large diameter wheel with apertures in it to allow solution flow to material;
apertures define the locations for plating; index pins engage the pilot holes (designated 38 in FIG. 3) in the leadframe;
backing belt is used to hold material on wheel and mask backside of material;
anode is stationary inside wheel.

Advantages: Fast, material never stops for selective plating; no timing issues; pumps, rectifiers, and drive system are on continuously; low cost because system is mechanically uncomplicated.

Disadvantages: Loose plating boundaries, poor spot location, and potential bleedout are not critical issues for the present invention.

A more precise, but also more costly and slower selective plating technique is the step-and-repeat process.

STEP AND REPEAT
Leadframe material is stopped in selective plating head;
rubber mask system clamps on material;
plating solution is jetted at material;
current is applied;
current is shut off;
solution is shut off;
head opens;
material moves.

Advantages: Very sharp plating spot with excellent edge definition; very good spot location capability when used with index holes, pins and feedback vision system.

Disadvantages: Slow; material must stop during selective plating; expensive equipment to buy and maintain; timing issues; lots of moving parts.

Figure 3:
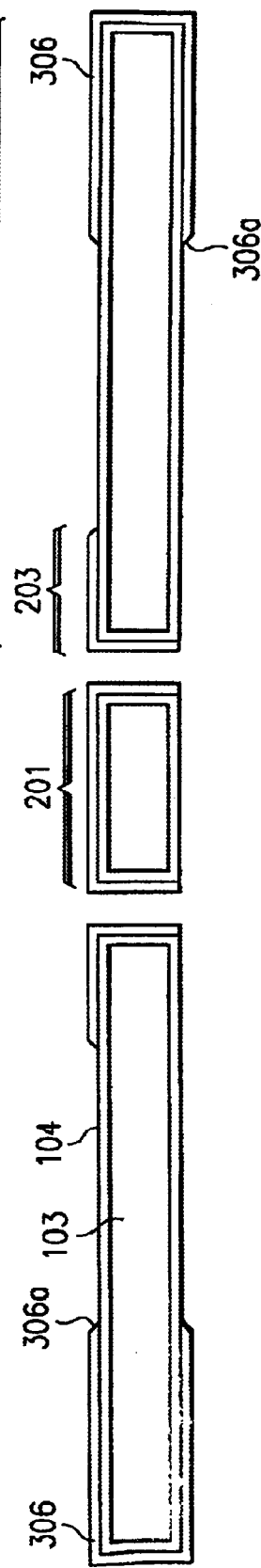
FIG. 3 is a schematic and simplified cross sectional view of a leadframe after the plating step for pure tin according to the invention.

The schematic cross section of a leadframe in FIG. 3 depicts a relatively thick pure tin layer 306, which is plated selectively onto the flood plated layer 104 of nickel over the leadframe base material 103. The tin layer has a thickness in the range from about 4.0 to 10.0 μm. The tin plated portions cover the areas of the leadframe intended for board attach or other parts attachment, specifically the second ends of the lead segments 302, remote from the chip mount pad. The boundary of the solder plated portion is designated 306a in FIG. 3. It is an advantage of the invention that boundary 306a may have loose tolerances.

It is of pivotal importance to the present invention that
  the pure tin represents a lead-free solder;
  the tin is deposited as a pre-plated layer, i.e., applied to the leadframe before the start of chip assembly;
  the tin has a reflow temperature of 232° C. so that IC assembly temperatures up to about 215° C. are tolerable, including wire bonding and package molding;
  the tin is able to dissolve into the solder flux or wave during device board attach, and
  the tin avoids tin whisker growth.

It is helpful for suppressing whisker growth that the pre-plated tin layer is in a matte, coarse grain, and low carbon content composition. Most important is the fact that the tin layer receives, due to its pre-plating deposition before the molding encapsulation process, a thorough annealing step during the extended molding compound polymerization period ("curing"; commonly at 175° C. for 5 to 6 hr). It is a technical advantage of the invention that this pivotal annealing step is provided without any additional time or cost during the assembly process.

It is an important aspect of the present invention to deposit the tin layer selectively onto the leadframe using a separate plating system with its characteristic speed and an inexpensive, temporary masking step, which leaves only those leadframe portions exposed which are intended to receive the solder layer. This tin plating system is depicted in FIG. 4 in conjunction with the nickel and palladium plating system as a complete process flow.

Figure 4:
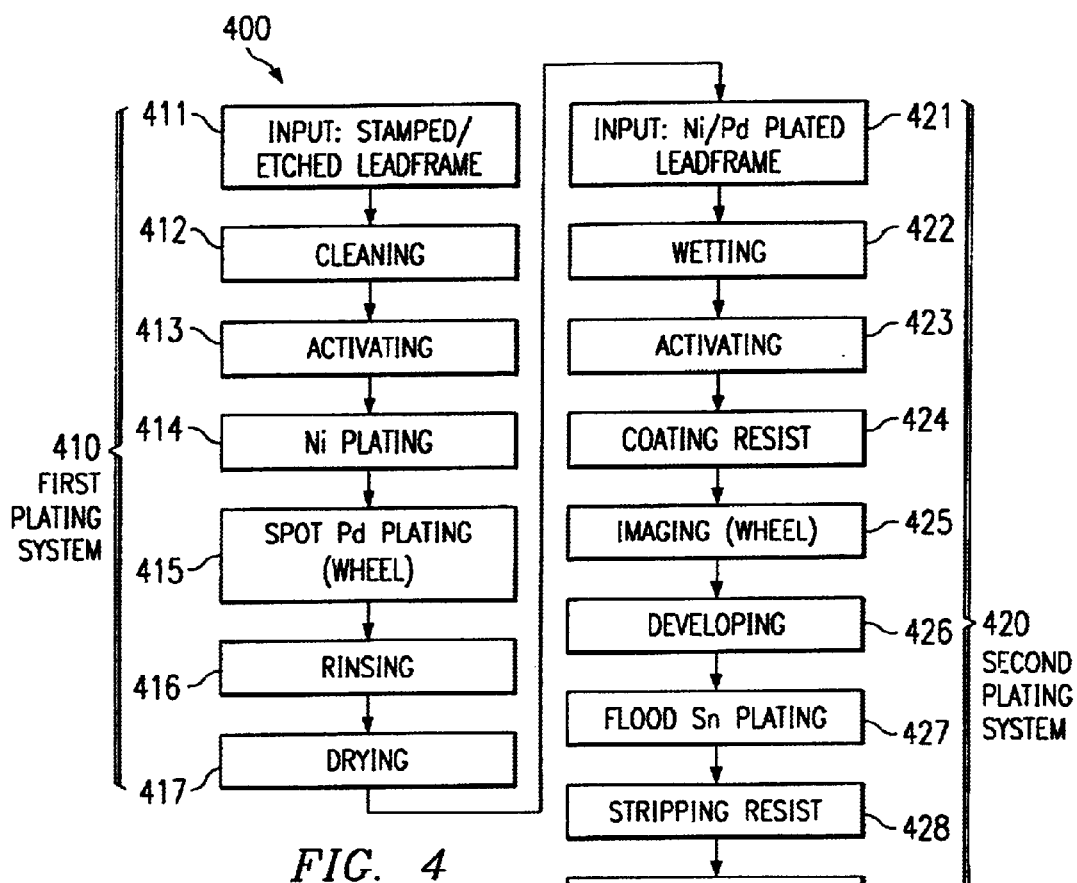
FIG. 4 is a block diagram of the process flow through the first plating system and the second plating system according to the invention.

FIG. 4 depicts the complete process flow according to the invention, generally designated 400, of plating the base metal of the leadframe with the nickel, palladium, and tin layers in two parts: Plating the nickel and palladium layers in a first plating system 410, coupled to a second plating system 420 including the tin plating stations. The stations of the first plating system 410 summarize the steps described above:

411: The input is a leadframe made of stamped or etched from a base metal such as copper;
412: cleaning of the leadframe, and
413: activating prepares the base metal for:
414: plating the nickel layer;
415: spot plating the palladium layer can be provided by the wheel method described above, or the step-and-repeat method;
416: rinsing and
417: drying complete the palladium plating phase. The leadframe has now the configuration depicted in FIG. 2 and exits the first plating system 410. The average throughput speed of system 410 is about 35 ft/min and thus about 20 times faster than the throughput speed of the second plating system 420 for the tin plating (order of 2 ft/min).

Figure 5:
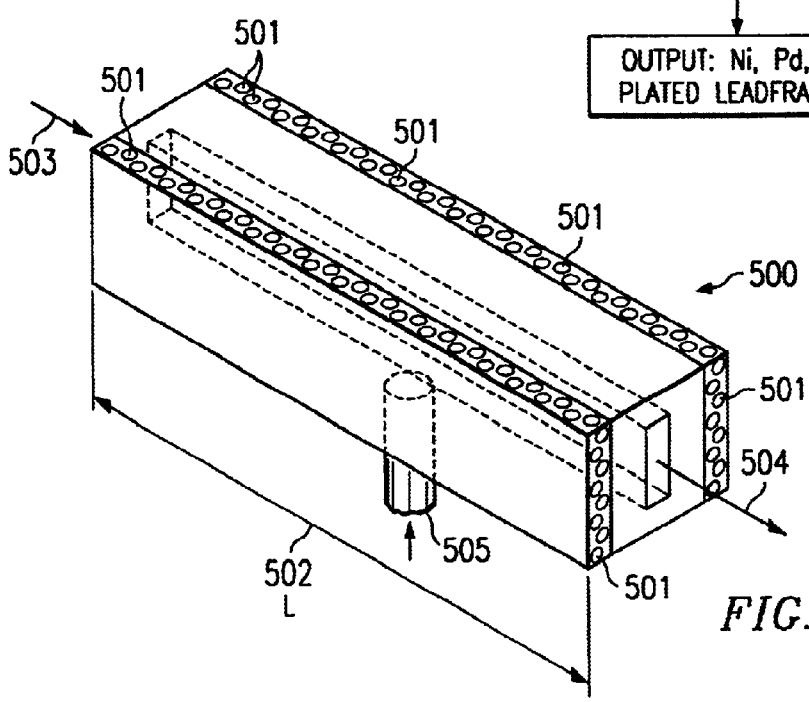
FIG. 5 is a schematic and simplified perspective view of the tin flood plating cell used in the second plating system according to the invention.

421: The input is the nickel and palladium-plated leadframe from system 410; it enters system 420;
422: wetting; no cleaning of the leadframe is required;
423: activating;
424: coating the leadframe with a plating resist;
425: photoimaging; a wheel is used with apertures defining the exposed areas of the resist; this is a line-of-sight process, devoid of sealing or bleedout issues. The imaging step is a dry process; consequently, it offers leadframe design opportunities not available for a wheel that must withstand plating solutions. The imaging is performed continuously, synchronized with all the other process steps;
426: developing; removing the resist in areas intended for plating;
427: tin plating; the tin plating equipment is designed as a flood cell and is schematically illustrated in FIG. 5. The flood cell, generally designated 500, is a simple polypro box with anode baskets 501 as soluble tin anodes lined along length L (designated 502) of the cell. The leadframe enters at 503 and exits at 504. The tin plating throughput can be increased by increasing the length L of cell 500. The residence time is a function of L and the leadframe speed; higher speed can be obtained by increasing length L. The electrolytic solution enters the cell at 505.
428: stripping the plating resist;
429: rinsing; and
430: drying complete the tin plating phase. The leadframe has now the configuration depicted in FIG. 3 and exits the second plating system 420 at the
431: output as a pre-plated nickel/palladium and tin leadframe.

The selective plating method of the invention offers a number of advantages in comparison to the alternative, conventional selective plating methods, namely the wheel method and the step-and-repeat method described above. In the step-and-repeat method, a rubber mask is clamped on the stationary leadframe during the plating process to define the plated area. This process results in excellent spot definition, but also in mechanical and timing issues in the plating head, which is short (about 12 inch) and thus causes a line speed for the tin deposit on the order of 2 ft/min. The step-and-repeat method is thus complicated and costly. For the wheel system, sealing of the mask to the leadframe is not as good as in the step-and-repeat method, so spot definition is not as good and tin deposit bleedout occurs. The size of the tin plating cell is limited, restricting the line speed. In both methods, the potential for tin contamination of the existing palladium spot is high.

In contrast, in the selective tin plating method of the invention:
  no tin contamination of the palladium spot occurs, since the palladium spot is protected by the plating mask;
  high plating throughput is provided by a long tin plating flood cell;
  soluble tin anodes can easily be incorporated into the tin cell, resulting cost savings;
  the tin spot definition is excellent;
  reel-to-reel technology can be applied;
  the plating line is uncomplicated and thus low cost;
  imaging and printing are performed continuously, in-line with the other steps in the tin plating process;
  low cost plating resist can be used, since the plating process is additive and does not have the requirements of a subtractive etch process; and alternatively, a printable plating mask could be used that eliminates the need for photoimaging and developing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the designs, cover areas and fabrication methods of the tin layer and of the palladium layer may be modified to suit specific leadframe or substrate needs. It is therefore intended that the appended claims encompass any such modifications or embodiments.

I claim:

1. A method for fabricating a leadframe structure comprising a chip mount pad and a plurality of lead segments, each having a first end near said mount pad and a second end remote from said mount pad, comprising the steps of:

forming said structure from a sheet-like starting material;

plating a layer of nickel on said leadframe;

selectively masking said second segment ends, thereby leaving said chip pad and said first segment ends exposed;

selectively plating a layer of palladium on said nickel layer on said exposed chip pad and segment ends in a thickness suitable for bonding wire attachment;

selectively masking said chip pad and said first segment ends, thereby leaving said second segment ends exposed; and selectively plating a layer of tin onto said nickel layer on said exposed segment ends in a thickness suitable for parts attachment.

2. The method according to claim 1 wherein said plating of said nickel layer and said plating of said selective palladium layer are performed in a first plating system providing for said palladium plating a wheel with apertures defining said selective locations.

3. The method according to claim 1 wherein said plating of said tin layer is performed in a second plating system providing photo-imagible or printable plating masks.

4. The method according to claim 3 wherein said second plating system provides:

coating with a plating resist;

photoimaging;

developing said resist;

plating with tin;

stripping said resist;

rinsing; and drying.

5. A method for fabricating a leadframe comprising the steps of:

stamping from a sheet-like copper or copper alloy starting material a leadframe having a mount pad for an integrated circuit chip and a plurality of lead segments having their first end near said mount pad and their second end remote from said mount pad;

in a first plating system, cleaning said leadframe in alkaline soak cleaning and alkaline electrocleaning;

activating said leadframe by immersing said leadframe into an acid solution, thereby dissolving any copper oxide;

immersing said leadframe into a first electrolytic nickel plating solution and depositing a first layer of nickel onto said copper, thereby fully encasing said copper;

immersing said leadframe into a second electrolytic nickel plating solution and depositing a second layer of nickel onto said first nickel layer, thereby adapting said second ends of said lead segments for mechanical bending and solder attachment;

selectively masking said second segment ends thereby leaving, through apertures in said wheel, said chip pad and said first segment ends exposed;

immersing said leadframe into an electrolytic palladium plating solution and depositing a layer of palladium onto said exposed segment ends in a thickness suitable for bonding wire attachment;

in a second plating system, selectively masking said chip pad and said first segment ends, thereby leaving said second segment ends exposed, said masking provided by photoresist coating, photoimaging, and resist developing;

immersing said leadframe into a tin flood cell plating solution and depositing a layer of tin onto said exposed second segment ends in a thickness suitable for parts attachment; and stripping said photoresist, rinsing and drying.

6. The method according to claim 5 wherein said first plating system is a wheel-based system, and said second plating system is a flood cell system.

7. The method according to claim 5 wherein the process steps are executed in sequence without time delays, yet including intermediate rinsing steps.

8. The method according to claim 5 wherein said acid solution may be sulfuric acid, hydrochloric acid or any other acid.

9. The method according to claim 5 wherein said photoimaging of said photoresist uses a wheel with apertures defining the exposed area of said resist.

* * * * *